United States Patent [19]

Okazaki et al.

[11] Patent Number: 4,975,412
[45] Date of Patent: Dec. 4, 1990

[54] METHOD OF PROCESSING SUPERCONDUCTING MATERIALS AND ITS PRODUCTS

[75] Inventors: Kenji Okazaki, Nicholasville; Robert J. De Angelis; Charles E. Hamrin, Jr., both of Lexington, all of Ky.

[73] Assignee: University of Kentucky Research Foundation, Lexington, Ky.

[21] Appl. No.: 158,570

[22] Filed: Feb. 22, 1988

[51] Int. Cl.$^5$ .............................................. C04B 35/64
[52] U.S. Cl. .......................................... 505/1; 264/27; 264/56; 505/725; 505/739; 505/822
[58] Field of Search ....................... 264/22, 25, 24, 27, 264/56, 61, 112, 113, 125; 505/1, 800, 809, 810, 812, 813, 822, 823, 725, 739; 419/5, 6, 8, 10, 19, 20, 21, 22, 65, 66, 68; 29/599

[56] References Cited

U.S. PATENT DOCUMENTS

| | | | |
|---|---|---|---|
| 2,643,434 | 6/1953 | Scharf | 264/27 |
| 3,143,413 | 8/1964 | Krapf | 264/56 |
| 3,170,966 | 2/1965 | Kemeny et al. | 264/27 |
| 3,213,491 | 10/1965 | Craig | 264/27 |
| 3,250,832 | 5/1966 | Metz | 264/27 |
| 4,762,754 | 8/1988 | Nellis et al. | 428/552 |

OTHER PUBLICATIONS

Robinson et al., "Sinter-Forged YBa$_2$Cu$_3$O$_{7-\delta}$" Advanced Ceramic Materials, vol. 2, No. 3B, Jul. 1987, 380–387.

Alford et al., "Physical and Mechanical Properties of YBa$_2$Cu$_3$O$_{7-\delta}$ Superconductors" Journal of Material Science 23 (1988) 761–768.

"Resistance Sintering Under Pressure" by F. V. Lenel, Journal of Metals, Jan. 1955, pp. 158–167.

"Northwestern Perspective" (Winter Edition), 1988.

"Introducing the Metal Matrix High Temperature Superconductor" by Murr, Hare and Eror, Advanced Materials and Processes, Oct. 1987, pp. 37–39.

*Primary Examiner*—Jan H. Silbaugh
*Assistant Examiner*—Mary Lynn Fertig
*Attorney, Agent, or Firm*—King & Schickli

[57] ABSTRACT

A method for fabricating relatively dense monoliths of superconducting material and relatively dense composite monoliths of superconducting material and binder material. The method includes the steps of placing the material to be processed in a die. A relatively high pressure is then applied to the material. Substantially simultaneously, an electrical discharge is applied to the material. The discharge is of a relatively high voltage and current density to provide sharp bonding while maintaining the superconducting properties of the material in the monolith product. A product fabricated by the present method is also described.

14 Claims, 2 Drawing Sheets

METHOD OF PROCESSING SUPERCONDUCTING MATERIALS AND ITS PRODUCTS

TECHNICAL FIELD

The present invention relates generally to the processing of powdered materials and, more particularly, to the processing of superconducting materials into either simple or complex shapes.

BACKGROUND OF THE INVENTION

Superconductors are materials that allow the flow of electric current without resistance at or below some critical transition temperature. Recent research has led to the development of superconductors with transition temperatures about the temperature of liquid nitrogen (77° K.). Research to identify superconductors with even higher transition temperatures is continuing.

Because of the unique electrical properties exhibited by superconductors, many believe that they possess some of the most exciting prospects for engineering development and application in this century. Such potential commercial applications range from, for example, the production of highly efficient power lines for use in transmitting electricity from power plants to distant cities to the development of high speed levitating trains.

Several different approaches have been suggested for processing superconducting materials for widespread commercial application. One such process developed at Northwestern University is known as sinter-forging. In sinter-forging, the ceramic superconducting material is fired under pressure in an effort to maximize its density in a monolith of desired shape. While the pure ceramic product is superconducting, it is also very brittle and, thus, not able to support any significant stress. This makes it impractical for most potential applications.

Superconducting ceramic matrix-metal composites have been suggested as a possible solution to the brittleness problem. In particular, it is believed metals such as copper, silver, gold and alumninum add strength to the superconducting ceramic. In addition, these metals do not significantly impair the efficient operation of the superconducting ceramic since these metals also possess low resistivities. Processing such a composite, however, creates a number of significant problems including the maintenance of the superconducting behavior of the final product.

In this regard, it should be noted that the sinter-forging process discussed above is not adapted to produce the desired metal superconducting ceramic matrix composite. More specifically, the relatively high temperatures and long fabrication times characteristic of this method tend to cause rapid oxidation of the metal in the composite and oxygen depletion of the superconducting lattice. This leads to an unacceptable degradation of superconducting properties.

In another process known as shock-wave consolidation, superconducting ceramic and a metal is placed into a die. The ceramic and metal is then consolidated into a contiguous monolith by dynamic compaction using shock waves generated by explosives. Because of short fabrication times and generation of relatively little heat, the degradation problems associated with the sinter-forging process are generally avoided. As such, composites of superconducting ceramic matrix and metal can be effectively fabricated with this method. Still, however, the method does have a number of shortcomings.

In particular, there is the danger associated with any use of explosives. Further, the size of the explosion required for consolidation is proportional to the size of the monolith to be produced. Thus, the size of the composite monolith that may be produced by this method is limited by the size of the explosion that can be safely controlled. Additionally, it should be appreciated that the rate of processing cannot be effectively controlled. Finally, only relatively simple shapes can be produced. A need is, therefore, identified for an improved method of processing both superconducting ceramic and metal—superconducting ceramic matrix composites into relatively complex monolithic shapes.

SUMMARY OF THE INVENTION

Accordingly, it is a primary object of the present invention to provide a method for processing superconducting materials and metal—superconducting ceramic matrix composites overcoming the above-described limitations and disadvantages of the prior art.

Another object of the present invention is to provide a method of fabricating superconducting materials in a very short time, and at ambient temperatures without the need of a protective atmosphere into a relatively dense monolith of either simple or complex shape.

Yet another object of this invention is the provision of a versatile method for processing either an intimate mixture or layers of a superconducting ceramic and matrix metal into a composite monolith by substantially simultaneously applying pressure and an electrical discharge of relatively high voltage and current density.

A further object of the invention is to provide a method of processing a layered or embossed composite monolith of superconducting ceramic matrix and metal exhibiting improved bonding but having a clearly defined interface between the ceramic and metal and substantially full conservation of superconducting properties after processing.

Still another object of this invention is to provide a monolith of either a superconducting ceramic or a metal—superconducting ceramic matrix composite at near theoretical density by substantially simultaneously applying pressure and a high voltage, high current density electrical discharge.

Additional objects, advantages, and other novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out the in appended claims.

To achieve the foregoing and other objects, and in accordance with the purposes of the present invention as described herein, an improved method is provided for processing a superconducting material into a relatively dense monolith. The method includes the initial step of placing the superconducting material into a die. The die may be constructed to form a monolith of a number of simple or complex shapes including, but not limited to, toroids, S-shapes, C-shapes, blocks, rings, or the like.

After the placing of the superconducting material in the die, comes the step of applying a relatively high pressure of substantially 1.0–15.0 kilopounds per square inch (ksi) to the material in the die. Substantially simultaneously with this application of pressure is the step of applying an electrical discharge to the material. The electrical discharge has a relatively high voltage of substantially 5.0–30.0 kilovolts (kV) and a relatively high current density of substantially 322.5 —6450.0 kiloamps per square inch (kA/in$^2$).

More preferably, the current density of the electrical discharge is substantially 322.5–3225.0 kA/in$^2$. Further, the pressure and electrical discharge are simultaneously applied to the superconducting material for a relatively short period of time of substantially 10–200 microseconds ($\mu$s). Together, the pressure and electrical discharge serve to quickly weld the material together. Advantageously, the material is provided with sufficient mass that the heat is rapidly dissipated by self-quenching. Thus, the superconducting properties of the superconducting material are maintained.

In accordance with a further aspect of the present invention, a method is provided for processing a superconducting material and a matrix material into a relatively dense composite monolith. The initial step of this method involves the placing of the superconducting material and matrix material into a die. Next comes the step of applying a relatively high pressure of substantially 1.0–15.0 ksi to the material in the die. Substantially simultaneously with the application of this pressure is the step of applying an electrical discharge to the material. As described above, the electrical discharge has a relatively high voltage of substantially 5.0–30.0 kV and a relatively high current density of substantially 322.5–6450.0 kA/in$^2$ or, more preferably, 322.5–3225.0 kA/in$^2$. Together, the pressure and electrical discharge serve to rapidly weld the materials together and are only applied for a relatively short time of substantially 10–200 $\mu$s.

Advantageously, the method of the present invention forms a relatively dense (80–90+ percent of theoretical density) composite monolith without employing high temperatures for an extended period of time. Thus, the metal binder material is not caused to react with oxygen, form oxides and degrade the superconductivity properties of the superconducting ceramic material. Because of the short duration of the electrical discharge, the local temperature rises to cause metal-to-oxide reactions substantially only at the matrix metal—superconducting ceramic interfaces. This results in better binder metal—ceramic contact which improves bonding advantageously without degrading the ceramic's unique chemistry, microstructure and superconductive behavior.

As a further advantage to the present method, composite materials may either be formed from superconducting material impregnated with the matrix material, from separate layers of superconducting and matrix materials or from a superconducting material pellet embedded in binder material. Thus, the method also includes the step of intimately mixing superconducting material and binder metal material before placing it into the die for compaction into a monolith. Alternatively, the method may include the additional step of layering the superconducting material and matrix material in the die as desired in order to form a composite monolith with distinct layers having clearly defined interfaces. Finally, the method may also include the step of pelleting the superconducting material and embedding the pellet(s) in binder material.

In addition, it should be appreciated that the method may also include the additional step of tailoring the properties of the superconducting monolith product by blending any known superconductor materials such as $YBa_2Cu_3O_y$, $NdBa_2Cu_3O_y$, $GdBa_2Cu_3O_y$ or the like or any known superconductor materials and matrix metals such as copper, silver, gold and even aluminum. This may be a particularly important aspect of the present invention when constructing monoliths for specific applications.

In a further aspect of the invention, in accordance with its objects and purposes, a dense monolith of superconducting material or a dense composite monolith of superconducting material and matrix material fabricated in accordance with the method set forth above are provided. By utilizing the present method, the monoliths may be constructed in either simple or relatively complex shapes as desired for any particular application. In addition, the method allows the convenient control of the rate of processing of the monoliths. Thus, the preferred alignment or orientation of superconducting particles may be obtained as desired by proceeding with the processing at a desired rate in a magnetic field. In addition, the monoliths may be created with (1) an intimately mixed structure of superconducting material and matrix material, and (2) individual layers of superconducting material and matrix material or (3) superconducting material embedded in binder material. Each of the latter two composite monoliths produced by this method are marked by improved bonding between the superconducting and matrix materials and clearly defined interfaces between the materials.

Still other objects of the present invention will become readily apparent to those skilled in this art from the following description wherein there is shown and described a preferred embodiment of this invention, simply by way of illustration of one of the modes best suited to carry out the invention. As it will be realized, the invention is capable of other different embodiments and its several details are capable of modifications in various, obvious aspects all without departing from the invention. Accordingly, the drawings and descriptions will be regarded as illustrative in nature and not as restrictive.

BRIEF DESCRIPTION OF THE DRAWING

The accompanying drawing incorporated in and forming a part of the specification, illustrates several aspects of the present invention, and together with the description serves to explain the principles of the invention. In the drawing.

Figure 1:
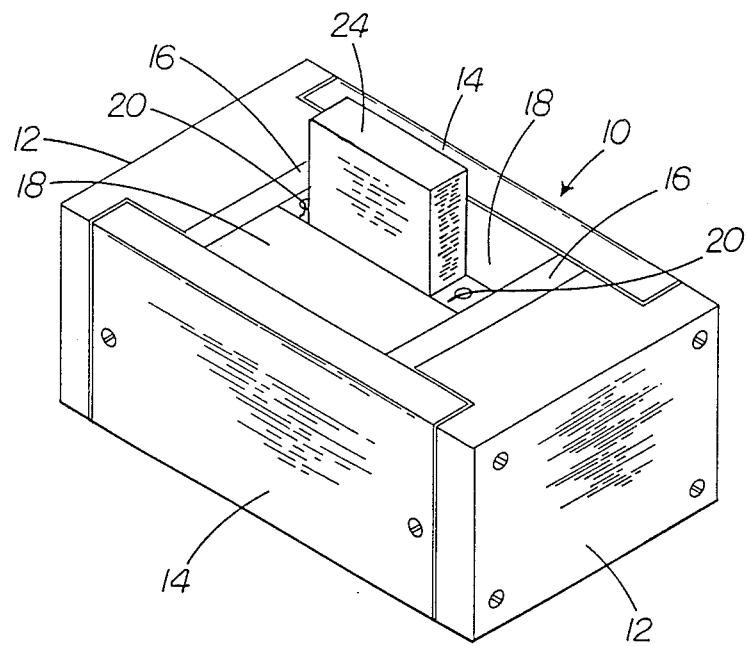
FIG. 1 is a perspective view of a die that may be utilized with the method of the present invention.

Reference will now be made in detail to the present preferred embodiment of the invention, an example of which is illustrated in the accompanying drawing.

DETAILED DESCRIPTION OF THE INVENTION

Reference is now made to the drawing figures which serve to help explain the method of the present invention. This versatile method allows the fabrication of relatively dense monoliths from superconducting materials. In addition, monoliths formed from a composite of superconducting ceramic materials and metal binder materials are also possible. Such composite monoliths may either be formed as an intimate mixture, in layers of superconducting ceramic and metal matrix or as a superconducting ceramic pellet or body embedded in a metal binder. Further, monoliths may be formed in either relatively simple or complex shapes as desired for any particular application.

Figure 2:
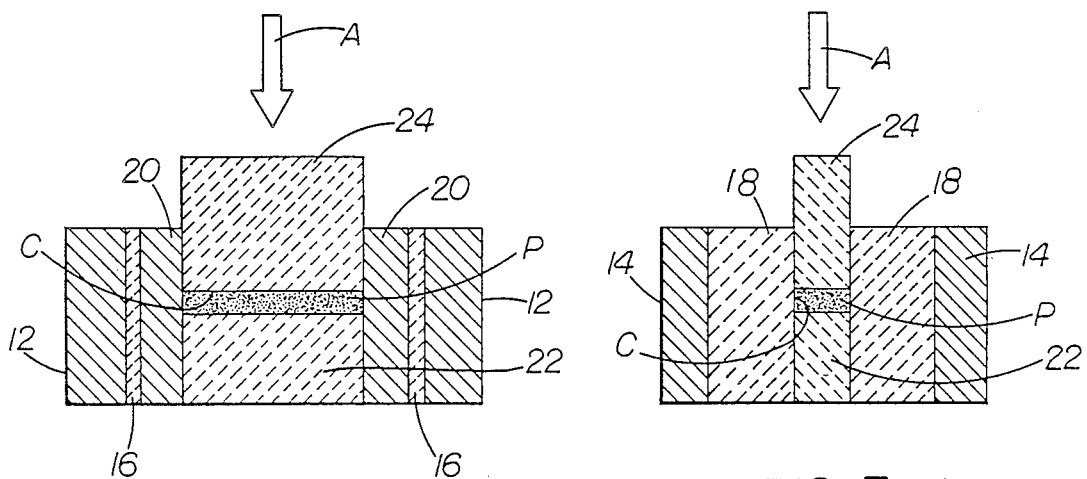
FIGS. 2 and 3 are cross-sectional views of the die shown in FIG. 1.
Figure 3:
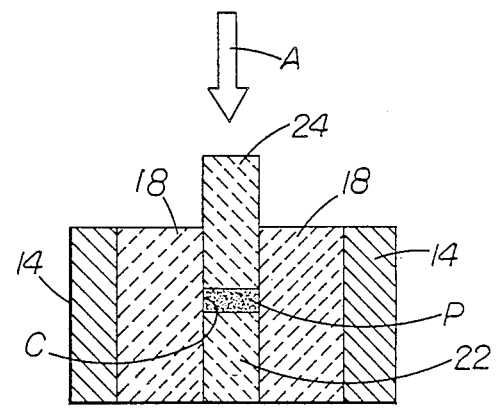

When making a monolith simply of superconducting material, the superconducting material, whether pelleted or in powder form, is placed or deposited directly into an insulated die 10 (see FIGS. 1-3) designed to compact the material into any particular shape. As shown for purposes of explanation, the die 10 is designed to form the superconducting material into a simple bar shape.

The die 10 includes an outer tool steel confinement of high strength in order to withstand the processing pressures. The confinement is formed by opposing tool steel end walls 12 and opposing tool steel side walls 14 that are securely fixed together.

An insulating mica insert 16 is provided across the inner face of each end wall 12. An insulating ceramic side block 18 extends between each mica insert 16 adjacent and in contact with each side wall 14. Of course, the tool steel side walls 14 serve to support the ceramic side blocks 18 during processing.

An electrode 20, is positioned at each end of the space between the side blocks 18 adjacent and against the mica inserts 16. A ceramic punch 22 is provided between the electrodes 20 and the ceramic side blocks 18. The punch 22 engages the inner walls of the electrodes 20 and the side blocks 18 so as to close the bottom of the die 10. Together, the ceramic side blocks 18, electrodes 20 and ceramic punch 22 define a die cavity C into which the superconducting powder or pelleted material P is placed for processing.

After placing powdered superconducting material P into the die 10, the die is vibrated to settle the powder. An upper punch 24 is then inserted between the electrodes 20 and ceramic side blocks 18 so as to close the top of the die cavity C. A positive pressure of approximately 4,000 psi is then applied by hydraulic press or some other means 26 (see FIG. 5) to the upper punch 24 (note also action arrow A in FIGS. 2 and 3) while the lower punch 22 is firmly maintained in position. This pressure serves to compact the powdered material P sufficiently to allow the effective measurement of the electrical resistance of the material undergoing processing in the die 10.

Figure 5:
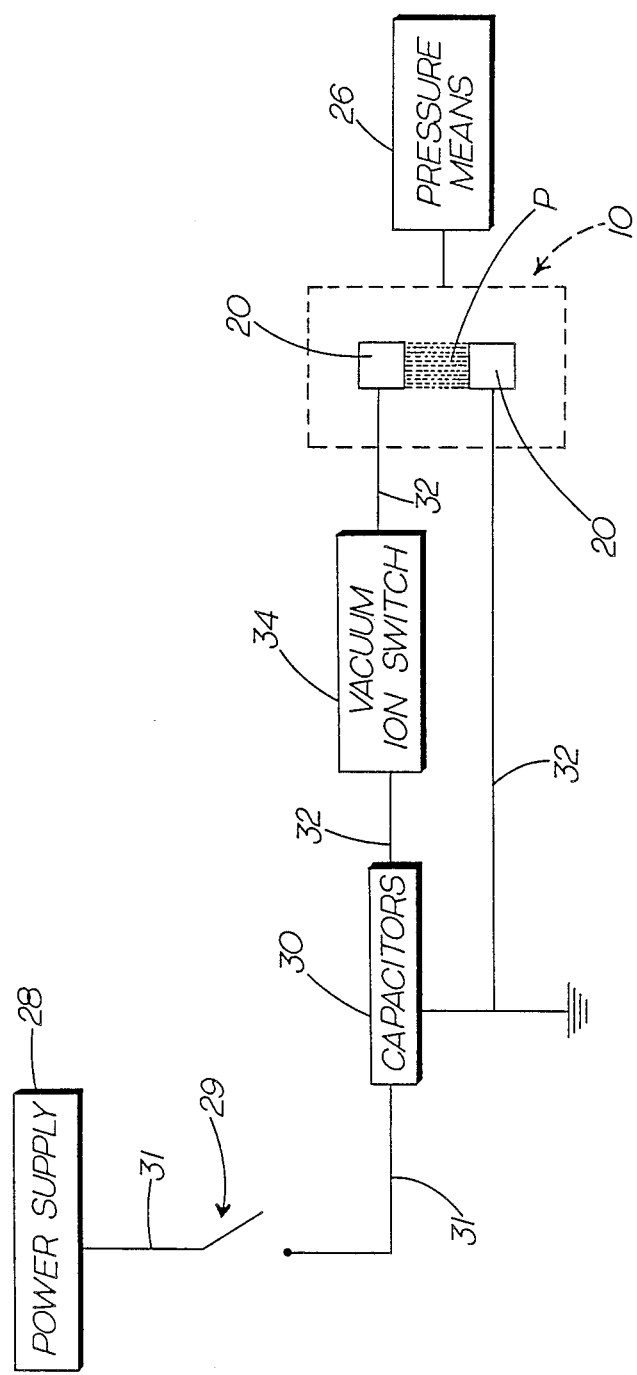
FIG. 5 is a schematic diagram of the circuit of an apparatus designed to perform the method of the present invention.

The measured resistance of the material P is compared to the resistance of the apparatus circuit see FIG. 5) including the power supply 28, capacitors 30 and connecting lead lines 31 and 32. The resistance of the material P being processed must be higher than the resistance of the apparatus circuit. Otherwise, the current applied during processing is just passed through the material and electrode discharge compaction does not take place. Conversely, the resistance of the material P must not be too high or an explosion may occur during processing. For purposes of example, for an apparatus circuit having a resistance of approximately 7 milliohms, the material being processed should have a resistance of between approximately 10 and 200 milliohms.

After verifying the proper resistance, the mechanical switch 29 is closed and the capacitors 30 are charged utilizing the power supply 28. Of course, any size capacitor or bank of capacitors 30 providing sufficient electric energy storage for processing may be utilized. In this regard, a capacitor or multicapacitor bank providing from approximately 240 to 720 $\mu$F is desired.

Once the capacitors 30 are charged, the superconducting material P in the die 10 is ready for processing. The press 26 is activated to apply a pressure to the material in the die 10 between approximately 1.0 and 15.0 ksi. Substantially, simultaneously, a vacuum ion switch 34 is then closed and the stored electrical energy in the capacitors 30 is discharged rapidly through the switch 34 and applied through the lead lines 32 and the electrodes 20 to the superconducting material. In fact, the necessary application of electrical discharge to complete bonding and compaction is of a duration of substantially 10 to 200 $\mu$s.

More specifically, the electrical discharge is applied with a relatively high voltage of 5.0 to 30.0 kV and a relatively high current density of 322.5 to 6450.0 kA/in$^2$ or, more preferably, between 322.5 to 3225.0 kA/in$^2$. Probes (not shown) may, of course, be provided to monitor these parameters. Together, the simultaneous application of the pressure and electrical discharge allows the superconducting material P to be compacted to between approximately 80-95% of theoretical density while also maintaining its superconducting properties.

A composite monolith of superconducting ceramic and matrix metal may also be produced by this method. In effect, any known superconducting material may be utilized and mixed with a matrix metal of low resistivity such as copper, silver, gold and even aluminum. More specifically, an intimate mixture of superconducting material and binder metal material is made as, for example, by milling or other known method. The proportions of the mixture and the specific superconducting material or mixture of superconducting materials utilized may be selected to provide the desired superconducting activity tailored specifically for any particular application. Typically, the mixtures will include anywhere from 5-25 weight % metal binder with the balance consisting of a superconducting ceramic.

Once the intimate mixture has been made, the powder P is placed into the die 10 as described above. The die is then vibrated to settle the powder mixture P and the upper punch 24 inserted to close the die.

After the die is closed, a pressure of approximately 4,000 psi is exerted on the mixture and the resistance of the mixture is measured. After confirming that the resistance of the mixture is greater than the resistance of the apparatus circuit but not so great as to create a possibility of explosion, pressure of approximately 1.0-15.0 ksi and an electrical discharge of approximately 5.0-30.0 kV and 322.5 to 6450.0 kA/in$^2$ and, more preferably, 322.5 to 3225.0 kA/in are substantially simultaneously applied to the powdered materials. This application continues for a relatively short period of time of substantially 10-200 microseconds to create a composite monolith having a density approximately 80-95% of theoretical density.

Since this monolith is formed at ambient temperatures in a very short period of time, the lattice structure of the superconducting material remains intact. More specifically, oxygen is not diffused from the lattice structure to form metal oxides with the metal binder material. This is true even when aluminum is utilized. This is a significant feature of the invention as it allows aluminum, which is relatively easily oxidized at higher temperatures, to be effectively used as a binder material. Aluminum is, of course, lighter and less expensive than other low resistivity binder materials such as copper, silver and gold. It also adds more strength to the composite than these other metals. As such, processing of a composite with aluminum as the binder material is likely to be preferred for most applications.

Where a composite monolith of layered structure is desired, the various layers of superconducting ceramic material and metal binder material are placed in the die 10. The amount of each material and its order of placement in the die may be varied in an effort to tailor the properties of the resulting composite monolith. Processing then continues as described above to fabricate a monolith of layered structure. Advantageously, a monolith fabricated in this manner evidences strong bonding between the metal and ceramic layers at the interface. In addition, a clearly defined interface is still maintained. As a result, the superconducting properties of the superconductor remain essentially unaltered by the processing.

A composite monolith with a superconducting ceramic core and an outer metal layer or shell may also be produced. Such a monolith is desirable since the outer metal shell acts as a barrier to protect the superconducting core from damaging moisture. In addition, the outer shell can act as a safety path for the flow of current in the event the superconducting material should ever lose its superconducting properties for whatever reason.

In order to fabricate this type of monolith, a quantity of matrix metal powder P is placed in the bottom of the die 10. A pellet (or pellets) of superconducting ceramic material, sufficiently compacted to retain its shape, is then placed in a central position within the die cavity. An additional quantity of metal binder powder is then added into the die cavity so as to surround the pellet. The materials are then processed as described above by: (1) inserting the upper punch 24 into the die; (2) applying relatively low pressure to the die and measuring the resistivity of the material being processed; (3) charging the capacitors 30; and (4) substantially simultaneously applying pressure and an electrical discharge to the materials being processed as described above.

Due to the extremely short processing time and the nature of the materials being processed, the temperature of the materials being processed only rises along the metal/ceramic interface(s). Temperatures along the metal surfaces at the interfaces instantaneously reach approximately a temperature higher than 1.000° C. to provide sharp bonding to the adjacent superconducting ceramic. Rapid passage of heat into the surrounding mass of the monolith, however, provides self quenching that serves to maintain the temperature level throughout the remainder of the materials sufficiently low so as to avoid any diffusion and resulting alteration of the oxygen position within the superconducting lattice. As a result, metal-to-oxide reactions only occur along the interface. Thus, the present process provides for better metal-ceramic bonding while the superconducting properties of the ceramic are maintained. In addition, because of the instantaneous nature of the heating and quenching, the processing may be completed without utilizing and providing any type of protective atmosphere.

Figure 4:
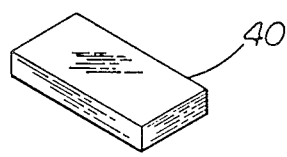
FIG. 4 is a perspective view of the compacted monolith produced by the method of the present invention.

A monolith, in the shape of a bar 40, fabricated in accordance with the method of the present invention described above is shown in FIG. 4.

The following examples are presented to further illustrate the invention, but it should be recognized that the invention is not to be considered as limited thereto.

EXAMPLE 1

A powdered composite of 25 weight percent copper (2.0 grams) and 75 weight percent $YBa_2Cu_3O_y$ (6.0 grams) was placed into a die of the type described and shown in the drawing figures. The die was then vibrated to settle the composite. An upper punch was then inserted in the die and a hydraulic press was activated to place 4,000 psi of pressure on the composite. The resistance of the composite powder was then measured to confirm that it was above that of the apparatus circuit and below 200 milliohms. Three 80.0 uF capacitors were then charged to provide up to 720 uF. The vacuum ion switch was then closed to simultaneously apply 4.00 ksi of pressure and an electrical current pulse of 5 kV and 800 $kA/in^2$ for 100 uS to the composite powder. The resulting compacted composite monolith was in the shape of a bar approximately 2.0" long by 0.5" wide by 0.08" thick with a packing density of over 90%. The monolith was then tested and exhibited the Meissner effect at 77° K. thereby showing maintenance of superconducting properties after processing.

EXAMPLE 2

A pellet of $NdBa_2Cu_3O_y$ was prepared by conventional compacting and sintering with a diameter of substantially 0.5" and a thickness of substantially 0.16". This pellet was embedded in powdered copper by first placing 3 grams of copper in the die. The die was then vibrated to provide an even covering of copper across the bottom of the die. The superconducting ceramic pellet was then carefully placed in a central location on the copper powder in the die and additional copper powder (3 grams) added to cover the pellet. The die was then again vibrated and the upper punch inserted in the die. The resistivity of the specimen was tested to confirm that it was above the resistivity of the apparatus circuit but below 200 milliohms. Three 80 uF capacitors were then charged to provide 725 uF. The vacuum ion switch was then closed to simultaneously apply 12.8 ksi of pressure and an electrical current pulse of 30 kV and 322.5 $kA/in^2$ to the composite for 20 $\mu s$. The resulting compacted composite monolith was in the shape of a bar having dimensions of approximately 2.0" in length, 0.5" in width and 0.129" in thickness. Again, the packing density was over 90%. The monolith was then tested and exhibited the Meissner effect at 77° K. thereby showing maintenance of superconducting properties after processing.

EXAMPLE 3

The steps of Example 2. are followed but aluminum powder is substituted for copper powder as the sheath metal.

In summary, numerous benefits result from employing the concepts of the present invention. The present invention provides a safe, efficient and effective method for fabricating relatively dense monoliths of pure superconducting material or composites of superconducting material and metal matrix material. Where composite monoliths are produced, a strong bond is provided at the interfaces between the binder metal and the superconducting ceramic. A distinct interface is, however, maintained. This is possible because of the relatively rapid processing which minimizes the build-up of heat in the materials as they are processed. In fact, the materials undergo rapid self-quenching that serves to limit metal-to-oxide reactions only along the interface and actually preserve the oxygen atoms in their proper position within the superconducting lattice structure. Thus, the superconducting properties of the superconducting material are maintained after processing.

The foregoing description of a preferred embodiment of the invention has been presented for purposes of illustration and description. It is not intended to be exhaustive or to limit the invention to the precise form disclosed. Obvious modifications or variations are possible in light of the above teachings. For example, the present method is adapted for the continuous processing of a monolith in the form of wire where pressure rolls act as a die. It is also possible to apply a magnetic field during processing of the materials so as to align the crystals of the superconducting ceramic where the ceramic is any high transition temperature ceramic of the type $REBa_2Cu_3O_y$; provided that RE has a magnetic moment (that is RE=Ho,Gd,Nd, for example). Further, additional mechanical strength may be provided to the processed materials by incorporating reinforcing elements, such as fibers, into the powders being processed. Also, lead wires can actually be embedded into the powders prior to processing. These wires will then be permanently attached to the final compacted monolith when processing is completed.

The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of processing a superconducting material having oxygen positioned within a lattice structure into a dense monolith utilizing a die, comprising the steps of:
   placing the superconducting material into said die;
   applying a relatively high pressure of substantially 1.0 to 15.0 ksi to said material in said die; and
   substantially simultaneously with the application of pressure applying an electrical discharge to said material to generate sufficient heat for bonding, said electrical discharge having a relatively high voltage of substantially 5.0 to 30.0 kV and a relatively high current density of substantially 322.5 to 6450.0 $kA/in^2$ whereby said material is rapidly bonded together so as to maintain oxygen in position in the superconducting lattice; said bonded material also having sufficient mass so that the heat is rapidly dissipated by self quenching whereby the superconducting properties of the superconducting material are maintained.

2. The method set forth in claim 1, wherein said current density of said electrical discharge is substantially 322.5 to 3225.0 $kA/in^2$.

3. The method set forth in claim 1, wherein said pressure and electrical discharge are applied to said superconducting material for a time period of substantially 10 to 200 us.

4. The method set forth in claim 1, including an additional step of tailoring properties of said superconducting material by blending different superconductors.

5. The method of claim 1, including a step of compacting the material to a density between 80 and 95% of theoretical density.

6. A method of processing a superconducting material and a bundle material into a dense composite monolith utilizing a die, comprising the steps of:
   placing the superconducting material and binder material into said die;
   applying a relatively high pressure of substantially 1.0 to 15.0 ksi to said material in said die; and
   substantially simultaneously with the application of pressure applying an electrical discharge to said material, said electrical discharge having a relatively high voltage of substantially 5.0 to 30.0 kV and a relatively high current density of substantially 322.5 to 6450.0 $kA/in^2$ whereby sufficient heat is rapidly provided particularly along superconducting material and binder material interfaces for bonding said materials together; said bonded material also having sufficient mass so that the heat is rapidly dissipated by self quenching whereby the superconducting properties of the superconducting material are maintained.

7. The method set forth in claim 6, including an additional step of intimately mixing said superconducting material and said binder material before placing into said die.

8. The method set forth in claim 6, including an additional step of layering said superconducting material and said binder material in said die.

9. The method set forth in claim 6, including the additional steps of pelleting said superconducting material and then embedding said pelleted superconducting material in said binder material.

10. The method set forth in claim 6, including an additional step of tailoring properties of said superconducting material by blending different superconducting materials and binder materials.

11. The method set forth in claim 10, wherein said binder materials are selected from a group consisting of copper, silver, gold, aluminum and any mixtures thereof.

12. The method set forth in claim 6, including the step of compacting the materials to a density between 80 and 95% of theoretical density.

13. The method set forth in claim 6, wherein said current density of said electrical discharge is substantially 322.5 to 3225.0 $kA/in^2$.

14. The method set forth in claim 6, wherein said pressure and electrical discharge are applied to said material for a time of substantially 100 to 200 us.

* * * * *

UNITED STATES PATENT OFFICE
CERTIFICATE OF CORRECTION

Patent No. 4,975,412                    Dated December 4, 1990

Inventor(s)  KENJI OKAZAKI, ROBERT J. De ANGELIS and
             CHARLES E. HAMRIN, JR.

It is certified that error appears in the above-identified patent and that said Letters Patent is hereby corrected as shown below:

Col. 10, Claim 6, line 17, delete "bundle" and insert

--binder--.

Signed and Sealed this

Fourteenth Day of July, 1992

Attest:

DOUGLAS B. COMER

Attesting Officer         Acting Commissioner of Patents and Trademarks